United States Patent
Tsay et al.

(10) Patent No.: US 8,173,456 B2
(45) Date of Patent: May 8, 2012

(54) METHOD OF MANUFACTURING A LIGHT EMITTING DIODE ELEMENT

(75) Inventors: Jenq-Dar Tsay, Kaohsiung (TW); Suh-Fang Lin, Hsinchu County (TW); Yu-Hsiang Chang, Hsinchu County (TW); Yih-Der Guo, Hsinchu (TW); Sheng-Huei Kuo, Pingtung County (TW); Wei-Hung Kuo, Hsinchu (TW); Hsun-Chih Liu, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 146 days.

(21) Appl. No.: 12/648,308

(22) Filed: Dec. 29, 2009

(65) Prior Publication Data

US 2011/0003410 A1 Jan. 6, 2011

Related U.S. Application Data

(60) Provisional application No. 61/223,060, filed on Jul. 5, 2009.

(51) Int. Cl.
*H01L 21/00* (2006.01)
(52) U.S. Cl. ............ 438/27; 438/34; 438/38; 438/46
(58) Field of Classification Search .......... 438/958, 438/22, 34, 38, 46, 973
See application file for complete search history.

(56) References Cited

U.S. PATENT DOCUMENTS

| | | | | |
|---|---|---|---|---|
| 5,874,747 A | * | 2/1999 | Redwing et al. | 257/77 |
| 7,871,845 B2 | * | 1/2011 | Yoon et al. | 438/47 |
| 2006/0154389 A1 | | 7/2006 | Doan | |
| 2008/0210969 A1 | * | 9/2008 | Yuan et al. | 257/98 |
| 2009/0309119 A1 | * | 12/2009 | Shinohara et al. | 257/99 |
| 2009/0315045 A1 | * | 12/2009 | Horie | 257/93 |

* cited by examiner

*Primary Examiner* — Kevin M Picardat
*Assistant Examiner* — Neil Prasad
(74) *Attorney, Agent, or Firm* — Jianq Chyun IP Office (57) ABSTRACT

A method of manufacturing a light emitting diode element is provided. A first patterned semi-conductor layer, a patterned light emitting layer, and a second patterned semi-conductor layer are sequentially formed on an epitaxy substrate so as to form a plurality of epitaxy structures, wherein the first patterned semi-conductor layer has a thinner portion in a non-epitaxy area outside the epitaxy structures. A passivation layer covering the epitaxy structures and the thinner portion is formed. The passivation layer covering on the thinner portion is partially removed to form a patterned passivation layer. A patterned reflector is formed directly on each of the epitaxy structures. The epitaxy structures are bonded to a carrier substrate. A lift-off process is performed to separate the epitaxy structures from the epitaxy substrate. An electrode is formed on each of the epitaxy structures far from the patterned reflector.

20 Claims, 13 Drawing Sheets

METHOD OF MANUFACTURING A LIGHT EMITTING DIODE ELEMENT

CROSS-REFERENCE TO RELATED APPLICATION

This application claims the priority benefit of U.S. provisional application Ser. No. 61/223,060 filed on Jul. 5, 2009. The entirety of the above-mentioned patent application is hereby incorporated by reference herein and made a part of specification.

BACKGROUND

1. Technical Field

The disclosure generally relates to a method of manufacturing a light emitting diode (LED) element, in particular, to a method of manufacturing an LED element with increased yield rate.

2. Description of Related Art

Due to advantages of long lifetime, small volume, high shock absorption, low heat and power saving, LEDs have been widely used in household appliances and indicators or light sources of various instruments. In recent years, LEDs are developing towards rich colorfulness and high luminance, so that the applications of LEDs have been expanded to mega-size display board, traffic light, and so on. It can be expected that LEDs can substitute tungsten lamps and mercury lamps in future and become lighting sources with electricity-saving and environmental friendly functions.

In the related art, LEDs can be fabricated through forming an epitaxy layer on a sapphire substrate. The method is suitable to fabricate LEDs on sapphire substrates by using semiconductor process. The electrodes of the LEDs are conventionally located at the same side of the epitaxy layer. Therefore, the problem of current crowding occurs in the LEDs to limit the heat dissipation efficiency.

To solve the above-mentioned problem, a vertical type LED is provided. To fabricate the vertical type LED, the epitaxy layer is patterned to form a plurality of epitaxy structures separated from each other, and then a passivation layer is formed on the side walls of the patterned epitaxy structures so as to obstruct the leaking current. Afterward, a bonding process is used to bond the epitaxy structures to a carrier substrate, and a laser lift-off process is used to separate the epitaxy structures from the sapphire substrate. Ultimately, electrodes are disposed on the epitaxy structures so as to form a plurality of LED chips.

However, when the laser irradiates the interface between the epitaxy structures and the sapphire substrate, a quite large barometric pressure is produced between the epitaxy structures and the sapphire substrate by the dissipating gases. The gases with high pressure cause peeling of the passivation layer formed on the side walls of the epitaxy structures, which results in poor reliability.

SUMMARY

The disclosure is directed to a method of manufacturing a light emitting diode element. A first patterned semi-conductor layer, a patterned light emitting layer, and a second patterned semi-conductor layer are sequentially formed on an epitaxy substrate so as to form a plurality of epitaxy structures, wherein the first patterned semi-conductor layer has a thinner portion in a non-epitaxy area outside the epitaxy structures. A passivation layer covering the epitaxy structures and the thinner portion is formed. A part of the passivation layer covering on the thinner portion is removed to form a patterned passivation layer. A patterned reflector is fanned directly on each of the epitaxy structures. The epitaxy structures are bonded to a carrier substrate. A lift-off process is performed to separate the epitaxy structures from the epitaxy substrate. An electrode is formed on each of the epitaxy structures far from the patterned reflector.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the embodiments of the disclosure, examples of which are illustrated in the accompanying drawings. Wherever possible, the same reference numbers are used in the drawings and the description to refer to the same or like parts.

Figure 1A:
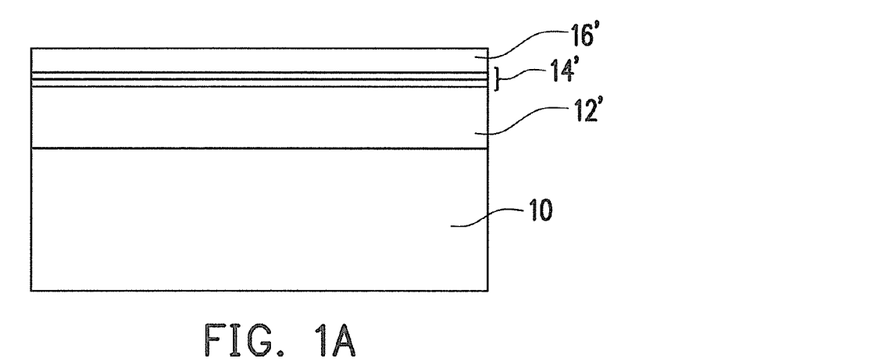
FIGS. 1A through 1G illustrate a method of manufacturing a light emitting diode (LED) element according to an embodiment of the disclosure.

FIGS. 1A through 1G illustrate a method of manufacturing a light emitting diode (LED) element according to an embodiment. Referring to FIG. 1A, first, a first semi-conductor layer 12', a light emitting layer 14', and a second semi-conductor layer 16' are sequentially formed on an epitaxy substrate 10. Herein, the epitaxy substrate 10 is, for example, a sapphire substrate, but in other embodiments the epitaxy substrate 10 may be other substrates suitable for manufacturing a light emitting diode element. In addition, the first semi-conductor layer 12' may be an N type-semi-conductor layer and the second semi-conductor layer 16' may be a p type-semi-conductor layer while the light emitting layer 14' may be a Multiple Quantum Well (MQW) active layer. The embodiment is not restricted in the elements mentioned above.

The light emitting layer 14' may be InGaN/GaN MQW active layer or AlGaN/GaN MQW active layer. The first semi-conductor layer 12' may be an N type-GaN base layer and the second semi-conductor layer 16' may be a P type-GaN base layer such as $P^+$ dopped-GaN layer, $P^+$ dopped-InGaN layer, or $P^+$ dopped-AlInGaN layer. If a current fluctuates between the first semi-conductor layer 12' and the second semi-conductor layer 16', the light emitting layer 14' is, for example, excited so as to generate a light with a wavelength from 250 nm to 600 nm.

Figure 1B:
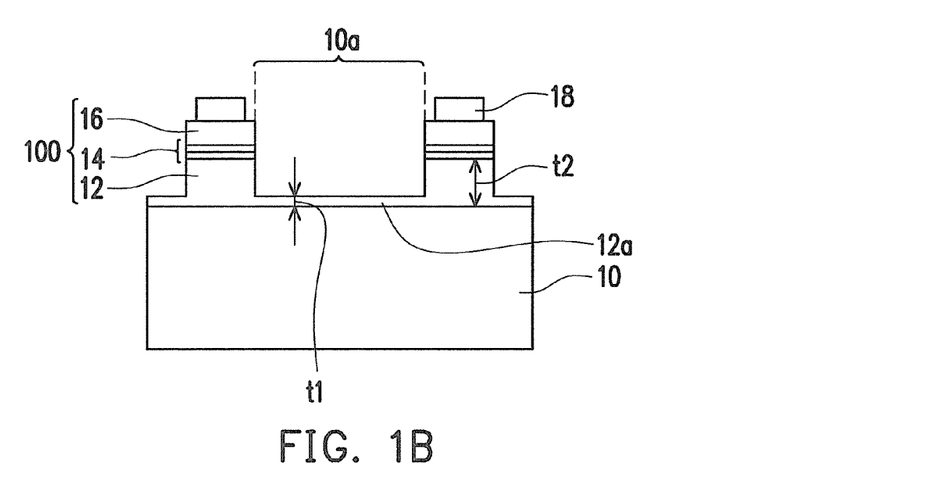

Next, referring to FIGS. 1A and 1B, the first semi-conductor layer 12', the light emitting layer 14', and the second semi-conductor layer 16' are partially removed to form a first patterned semi-conductor layer 12, a patterned light emitting layer 14, and a second patterned semi-conductor layer 16. The first patterned semi-conductor layer 12, the patterned light emitting layer 14, and the second patterned semi-conductor layer 16 are closely stacked together to construct a plurality of epitaxy structures 100. In addition, the first patterned semiconductor layer 12 has a thinner portion 12a between two epitaxy structures 100, and the thinner portion 12a is thinner than the first semiconductor layer 12' shown in FIG. 1A. Namely, the thickness t1 of the thinner portion 12a is smalled than the thickness t2 of other portions of the first patterned semiconductor layer 12. Herein, a plurality of non-epitaxy areas 10a of the epitaxy substrate 10 is defined outside the disposition location of the epitaxy structures 100. In another word, the non-epitaxy area 10a is the area where the epitaxy structures 100 are not disposed.

In the embodiment, the first semi-conductor layer 12', a light emitting layer 14', and a second semi-conductor layer 16' are patterned by performing an etching process, such as an inductively coupled plasma (ICP) etching process, a reactive ion etching (RIE) process or a wet etching process, etc. The etching depth of the etching process is, for example, properly adjusted so as to expose side walls of the parttered light emitting layer 14 and form the thinner portion 12a. In addition, a plurality of patterned reflectors 18 are fanned on the epitaxy structures 100, respectively. The patterned reflectors 18 are formed on the second patterned semi-conductor layer 16. The material of the patterned reflectors 18 can be ITO, Ag, Al, Ni, Cr, Au, Pt, Ti, Mg, Mo, W, Ta, TaN, TiN, or a combination thereof. In the embodiment, the patterned reflectors 18 are electrically conductive layers and thus are apt to provide the electrical connections between the epitaxy structures 100 and other elements.

Figure 1C:
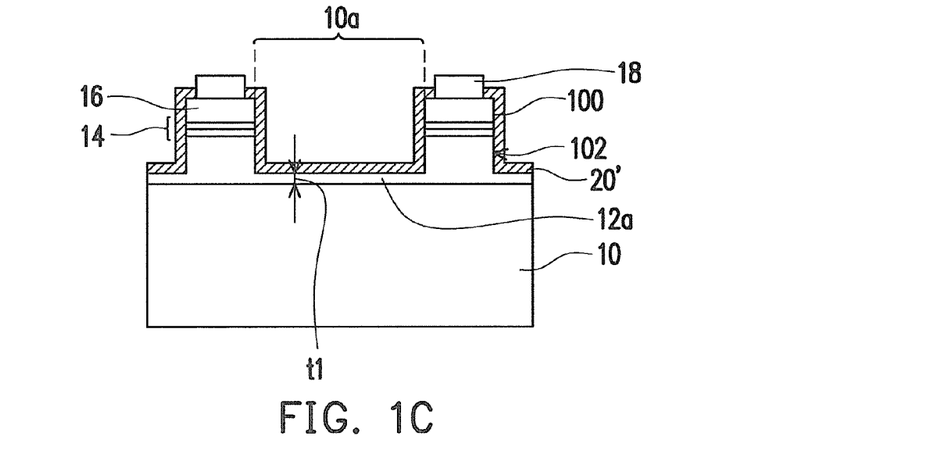

Thereafter, referring to FIG. 1C, a passivation layer 20' is formed on the epitaxy substrate 10. A material of the passivation layer 20 is $SiO_2$, SiNx SU-8 Photoresist, or spin on glass (SOG). A thickness of the passivation layer 20' can be 0.1 um to 1 um. In another embodiment, the thickness of the passivation layer 20' may be 0.3 um to 0.9 um, and may preferably be 0.3 um to 0.6 um. In addition, the thermal expansion coefficient of the passivation layer 20' may be 1 ppm/K to 50 ppm/K.

The passivation layer 20' covers the side walls 102 of the epitaxy structures 100, which is conducive to maintain the characteristic of the epitaxy structures 100. In addition, the passivation layer 20' also covers the thinner portion 12a which is located in the non-epitaxy area 10a between the epitaxy structures 100. In the embodiment, the patterned reflectors 18 are formed before forming the passivation layer 20', but the disclosure is not restricted thereto. In other embodiments, the passivation layer 20' can be formed before forming the patterned reflectors 18.

Figure 1D:
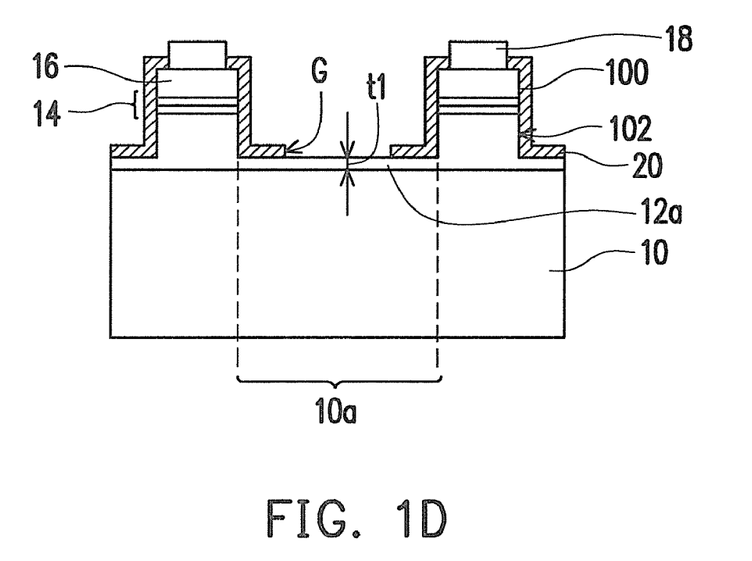

Then, referring to FIGS. 1C and 1D simultaneously, a part of the passivation layer 20' is removed to form a patterned passivation layer 20 having a gap G. The gap G exposes a part of the thinner portion 12a between the epitaxy structures 100. The patterned passivation layer 20 is not continuous in the non-epitaxy area 10a in the embodiment.

Figure 1E:
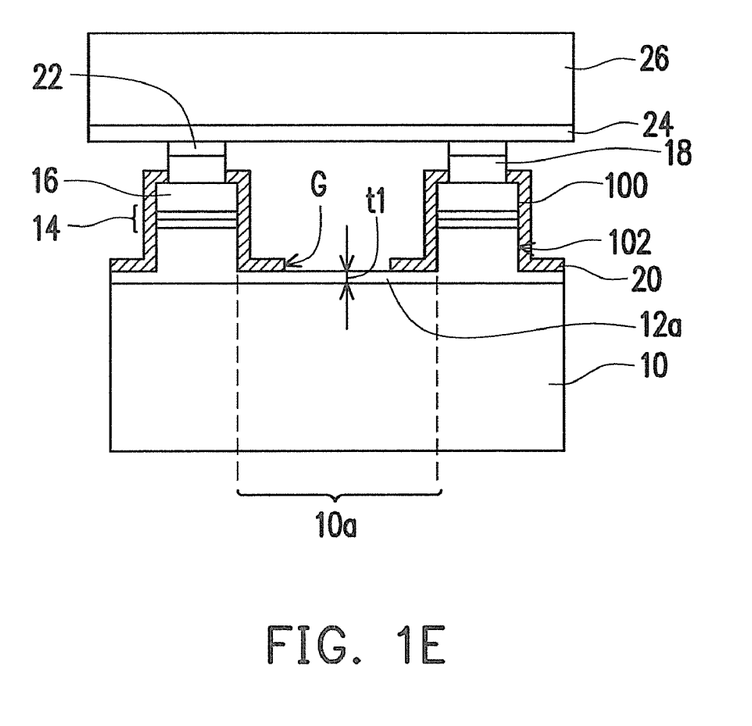

Next, referring to FIG. 1E, a barrier layer 22 is formed on each of the patterned reflectors 18, and then the epitaxy structures 100 with the patterned reflectors 18 disposed thereon are bonded to a carrier substrate 26 through an adhesive layer 24. The process of bonding the epitaxy structures 100 to the carrier substrate 26 can be a eutectic connection process. A material of the adhesive layer 24 of the embodiment may be AuSn, Au or other adhesive materials. Furthermore, the barrier layer 22 consisted of Ti, Pt, Au or a combination thereof can be disposed on the patterned reflectors 18 before the eutectic connection process so as to prevent the diffusion effect generated between the patterned reflectors 18 and the adhesive layer 24. The carrier substrate 26 may be a substrate with high heat dissipation, for example, a silicon substrate. However, the embodiment is not restricted in the above descriptions.

Figure 1F:
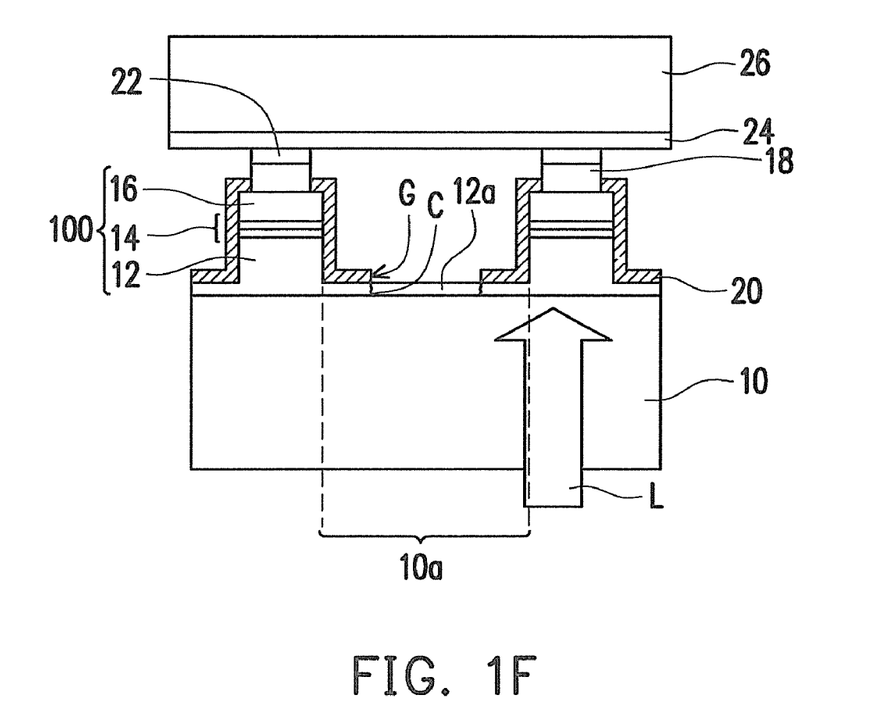

After that, referring to FIG. 1F, a laser lift-off process is performed to separate the epitaxy structures 100 from the epitaxy substrate 10. A laser beam L is irradiated to the epitaxy structures 100 through the epitaxy substrate 10. In the embodiment, the material of the first patterned semi-conductor layer 12 is GaN. When the energy of the laser beam L is high enough to decompose GaN into $N_2$ gas and Ga metal, the epitaxy structures 100 are capable of being separated from the epitaxy substrate 10, that is, the laser lift-off method is performed.

If the patterned passivation layer 20 is continuous in the non-epitaxy area 10a and contacts the epitaxy substrate 10, the patterned passivation layer 20 may be cracked or peeled by suffering the pressure of the escaping $N_2$ gas. Therefore, the characteristic of the epitaxy structures 100 is negative influenced. A path of a leakage current is then generated along the cracks of the patterned passivation layer 20 on the side walls 102 of the epitaxy structures 100. Accordingly, the thinner portion 12a is sandwiched between the patterned passivation layer 20 and the epitaxy substrate 10, and the gap G is formed in the patterned passivation layer 20 in the non-epitaxy area 10a in the embodiment. The $N_2$ gas is capable of dissipating through the gap G and the thinner portion 12a provides a buffer effect so that the patterned passivation layer 20 is not damaged by the pressure of the $N_2$ gas. The element manufactured by the method according to the embodiment has enhanced quality and increased yield rate. After the laser lift-off process, the thinner portion 12a may have cracks C due to the pressure of the escaping $N_2$ gas. The cracks C has no negative influence on the epitaxy structures 100. Accordingly, the epitaxy structures 100 is increased quality and increased yield rate.

Figure 1G:
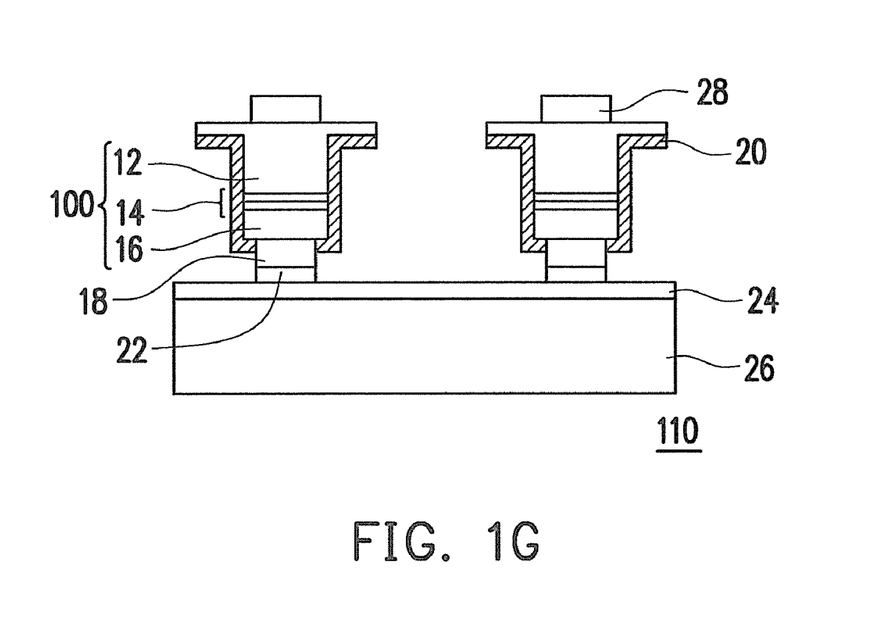

Next, referring to FIG. 1G, an electrode layer 28 is formed on each of the epitaxy structures 100 so as to faun a light emitting diode (LED) element 110. The electrode layer 28 is formed on the surface of each of the epitaxy structure 100 far from the patterned reflector 18. The electrode layer 28 is directly formed on the first patterned semi-conductor layer 12 of one epitaxy structure 100. In the embodiment, the electrode layer 28 can be an N type-electrode layer. As described above, the patterned passivation layer 20 has no cracks, and the path of the leakage current is not generated so that the LED element 110 is increased quality.

Figure 2A:
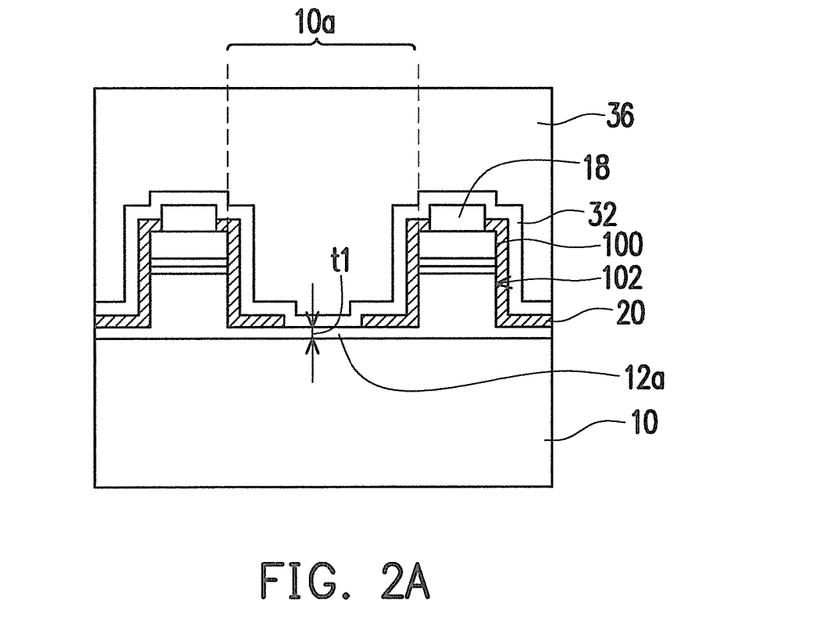
FIGS. 2A through 2C illustrate another method of bonding the epitaxy structures to a carrier substrate according to another embodiment of the disclosure.
Figure 2B:
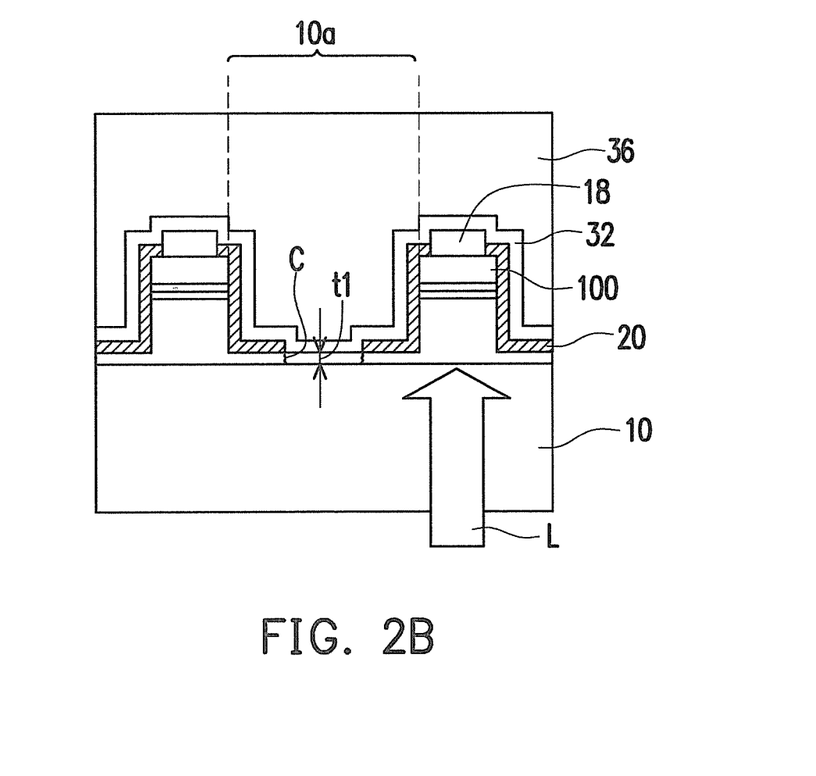
Figure 2C:
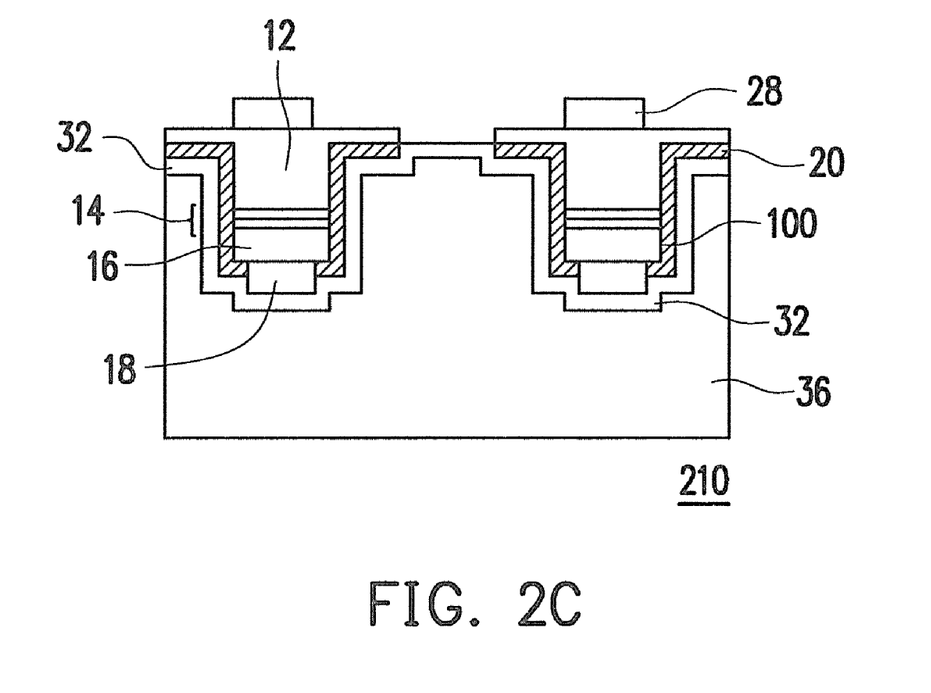

In addition to the abovementioned eutectic connection process, another method of bonding the epitaxy structures 100 to the carrier substrate 26 is provided. FIGS. 2A through 2C illustrate another method of bonding the epitaxy structures to the carrier substrate according to another embodiment. Referring to FIG. 2A, the epitaxy substrate 10 with a plurality of epitaxy structures 100 disposed thereon as shown in FIG. 1D is provided. Herein, the patterned reflector 18 is disposed on each of the epitaxy structures 100, and the patterned passivation layer 20 is dispose on the side walls 102 of the epitaxy structures 100 and a part of the non-epitaxy areas 10a of the epitaxy substrate 10 as shown in FIG. 1D. The epitaxy substrate 10, the epitaxy structures 100, the patterned reflectors 18 and the patterned passivation layer 20 are the same as those shown in FIG. 1D, and detail descriptions of these elements are referred to the aforesaid embodiment. Accordingly, the methods of manufacturing the epitaxy structures 100, the patterned reflectors 18 and the patterned passivation layer 20 are similar to those mentioned above, and are not repeated here.

As shown in FIG. 2A, the method of bonding the epitaxy structures 100 to the carrier substrate 36 includes forming a seed layer 32 on the epitaxy substrate 10 and performing an electroplating process or an electroless plating process to form the carrier substrate 36. Herein, the seed layer 32 is conformally formed on the epitaxy substrate 10, the patterned passivation layer 20, and the patterned reflectors 18. The electroplating process may be an electrochemically anodizing. Accordingly, the carrier substrate 36 is, for example, a metal substrate if the electroplating process is selected. The material of the carrier substrate 36 fills the non-epitaxy area 10a. Therefore, the epitaxy structures 100 are embedded in the carrier substrate 36.

Next, referring to FIG. 2B, the laser beam L is irradiated to the epitaxy structures 100 through the epitaxy substrate 10 so as to separate the epitaxy structures 100 from the epitaxy substrate 10. The patterned passivation layer 20 is not continuous in the non-epitaxy area 10a and the thinner portion 12a is sandwiched between the patterned passivation layer 20 and the epitaxy substrate 10 so that the patterned passivation layer 20 is not cracked by the pressure of the escaping $N_2$ gas during the laser lift-off process. In other words, the laser lift-off process does not damage the patterned passivation layer 20 and thus the yield rate of the embodiment is improved. Similarly, the thinner portion 12s may have cracks C due to the pressure of the escaping $N_2$ gas during the laser lift-off process.

Then, referring to FIG. 2C, the electrode layers 28 are formed on each of the epitaxy structures 100 to accomplish the LED element 210, wherein the method of forming the electrode layer 28 is capable of being referred to the above method as shown in FIG. 1G. The electrode layer 28 can be an N type-electrode in the embodiment. The patterned passivation layer 20 is not continuous between the epitaxy structures 100 so that the patterned passivation layer 20 is not cracked or peeled during the laser lift-off process in the embodiment. Therefore, the characteristic of the LED element 210 is increased and the path of the leakage current can be better constrained.

Figure 3A:
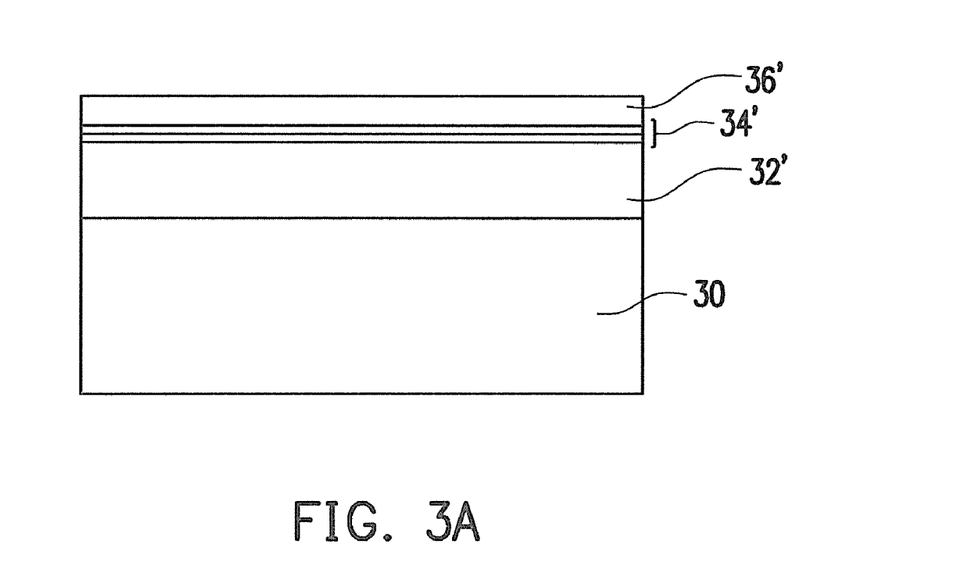
FIGS. 3A through 3G illustrate a method of manufacturing an LED element according to another embodiment of the disclosure.

FIGS. 3A through 3G illustrate a method of manufacturing an LED element according to another embodiment. Referring to FIG. 3A, a first semi-conductor layer 32', a light emitting layer 34' and a second semi-conductor layer 36' are sequentially formed on an epitaxy substrate 30. Herein, the materials of the first semi-conductor layer 32', the light emitting layer 34' and the second semi-conductor layer 36' can be the same as those of the first semi-conductor layer 12', the light emitting layer 14' and the second semi-conductor layer 16' disclosed in the aforesaid embodiment of FIG. 1A. Similarly, the epitaxy substrate 30 can be a sapphire substrate in the embodiment.

Figure 3B:
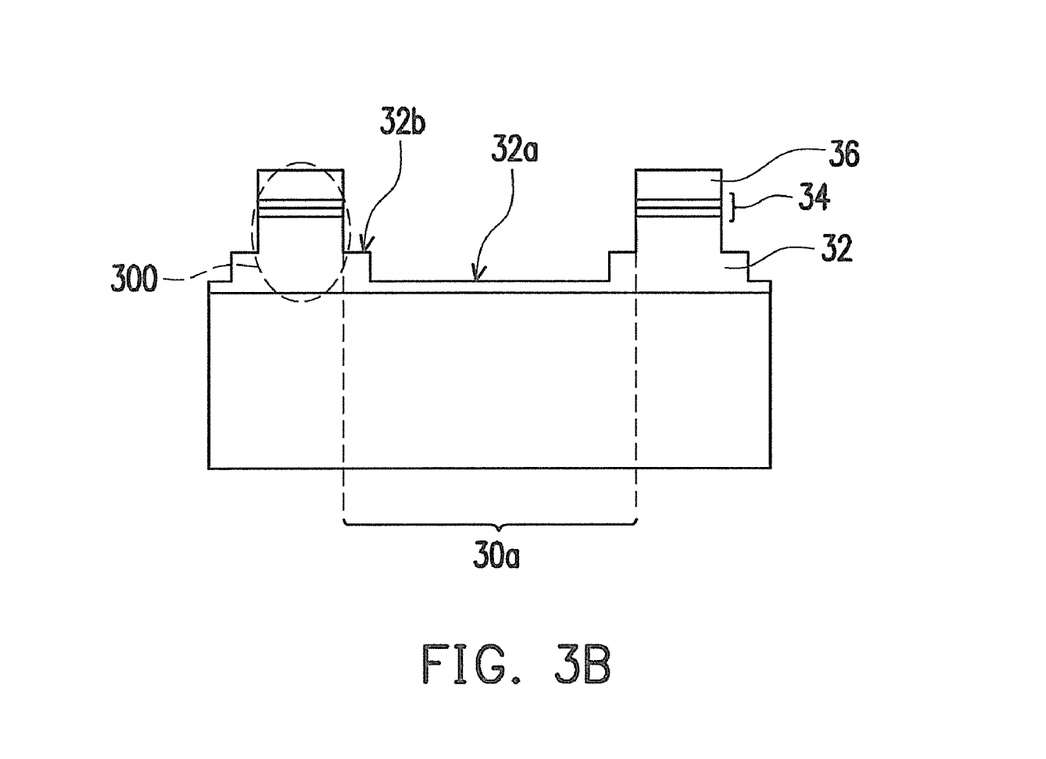

Then, referring to FIGS. 3A and 3B simultaneously, the first semi-conductor layer 32', the light emitting layer 34' and the second semi-conductor layer 36' are partially removed such that a first patterned semi-conductor layer 32, a patterned light emitting layer 34 and a second patterned semi-conductor layer 36 are formed on the epitaxy substrate 30. The first semi-conductor layer 32', the light emitting layer 34' and the second semi-conductor layer 36' can be partially removed by performing the photolithography process and the etching process twice in the embodiment. Accordingly, the first patterned semi-conductor layer 32 has at least one first thinner portion 32a and a plurality of second thinner portions 32b. The photolithography process and the etching process can be performed merely once to form the first patterned semi-conductor layer 32, the patterned light emitting layer 34 and the second patterned semi-conductor layer 36 in other embodiments, and the embodiment is not restricted here. If the first patterned semi-conductor layer 32, the patterned light emitting layer 34 and the second patterned semi-conductor layer 36 are formed by performing the photolithography process and the etching process merely once, a half-tone mask, a gray-tone mask, or the like may be used in the photolithography process.

A part of the first patterned semi-conductor layer 32, the patterned light emitting layer 34 and the second patterned semi-conductor layer 36 are stacked tightly to form a plurality of epitaxy structures 300. A non-epitaxy areas 30a is defined on the epitaxy substrate 30. The non-epitaxy area 30a is the area without the epitaxy structures 300 disposed therein. The first thinner portion 32a and the second thinner portions 32b of the first patterned semi-conductor layer 32 are located inside the non-epitaxy area 30a. A thickness of the first thinner portion 32a is thinner than that of the second thinner portions 32b. The second thinner portions 32b are closely connected to the epitaxy structures 300, and the first thinner portion 32a is located between two second thinner portions 32b. The first thinner portion 32a is located at the centre portion of the non-epitaxy area 30a while the second thinner portions 32b are located between the first thinner portion 32a and the epitaxy structures 300.

Figure 3C:
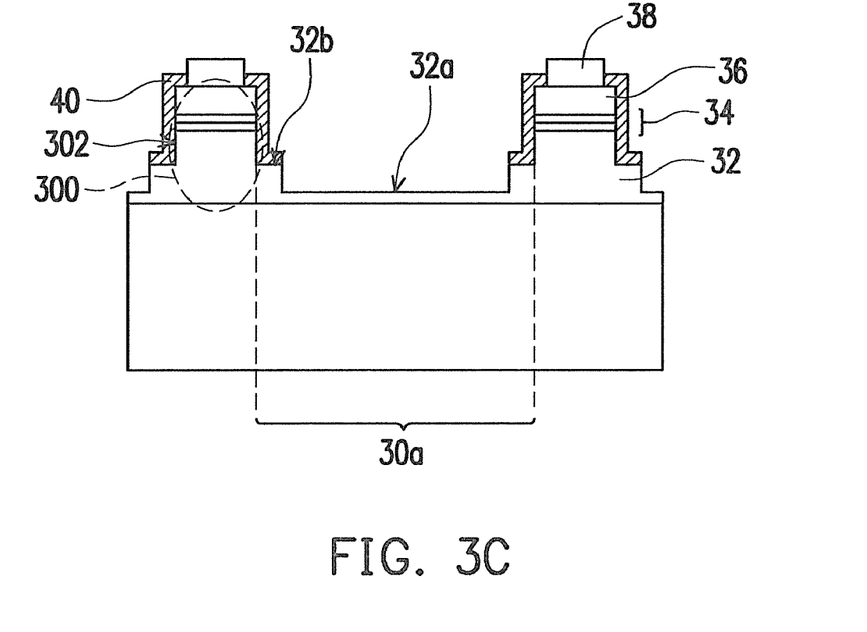

Next, referring to FIG. 3C, a plurality of patterned reflectors 38 and a patterned passivation layer 40 are formed on the epitaxy substrate 30. The methods of forming the patterned reflectors 38 and the patterned passivation layer 40 can be referred to those of the first embodiment, and are not repeated again. The embodiment does not limit the order of the formation of the patterned reflectors 38 and the formation of the patterned passivation layer 40. Each of the patterned reflectors 38 is disposed on the second patterned semi-conductor layer 36 of one epitaxy structure 300. The patterned passivation layer 40 is disposed directly on the side walls 302 of the epitaxy structures 300 and also disposed on the second thinner portions 32b of the first patterned semi-conductor layer 32. The patterned passivation layer 40 is not continuous in the non-epitaxy area 30a and the first thinner portion 32a of the first patterned semi-conductor layer 32 is exposed by the patterned passivation layer 40.

Figure 3D:
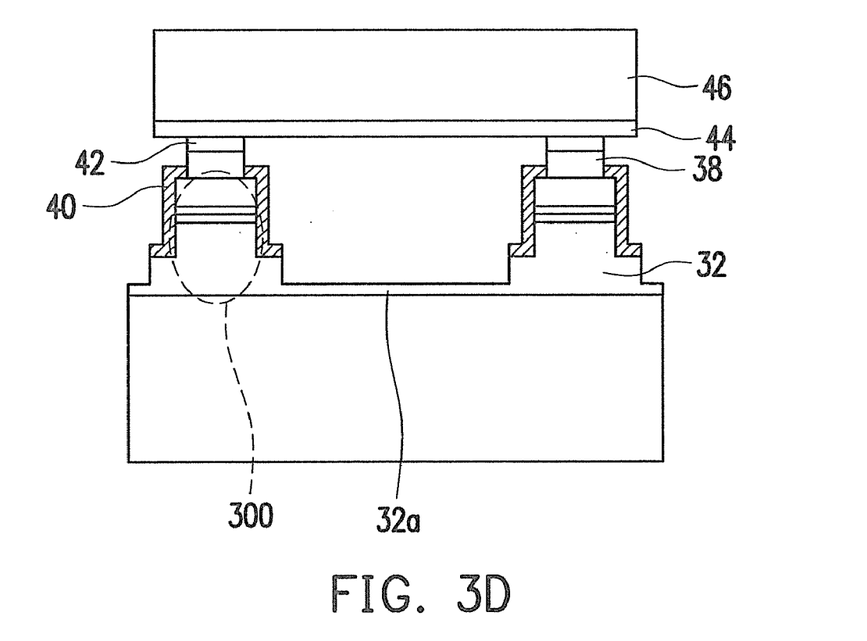

Thereafter, referring to FIG. 3D, the epitaxy structures 300 with the patterned reflectors 38 and the patterned passivation layer 40 disposed thereon are bonded to a carrier substrate 46 through an adhesive layer 44. The method of bonding the epitaxy structures 300 to the carrier substrate 46 is, for example, a eutectic connection process. In the embodiment, the barrier layer 42 can be further formed between the patterned reflectors 38 and the adhesive layer 44 so as to prevent the diffusion effect between the patterned reflectors 38 and the adhesive layer 44. The materials of the carrier substrate 46, the adhesive layer 44 and the barrier layer 42 can be referred to the foregoing embodiments, and are not repeated here.

Figure 3E:
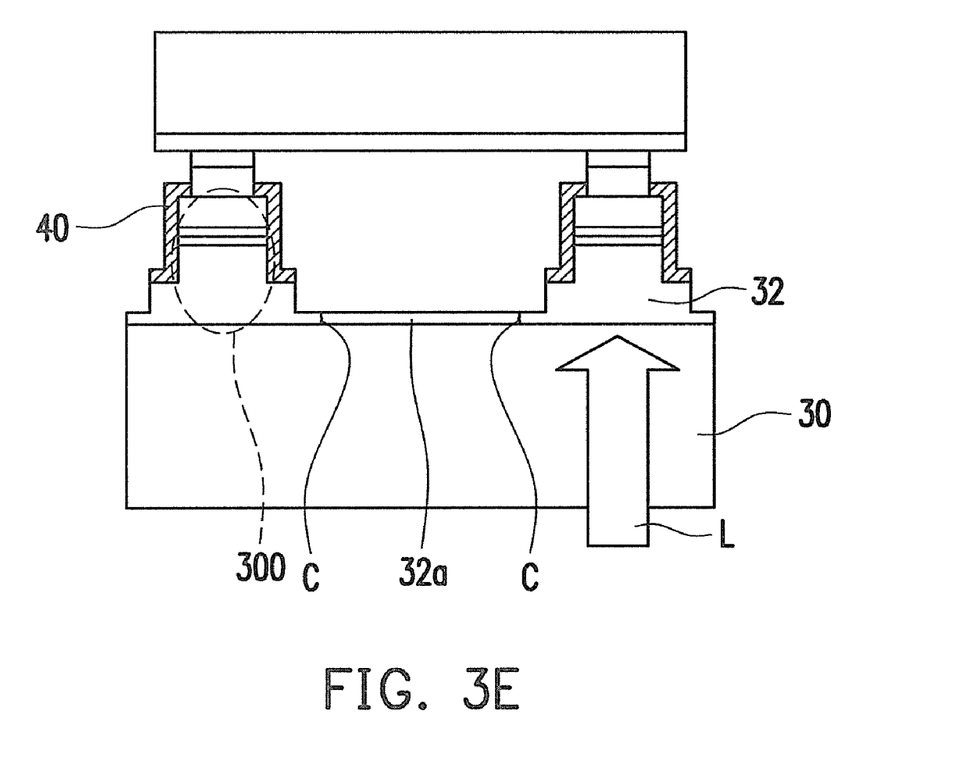
Figure 3F:
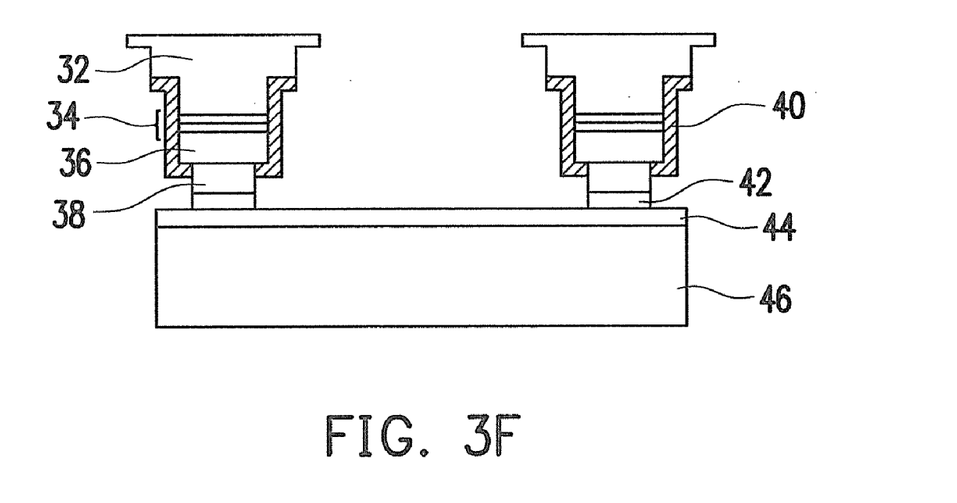

In addition, referring to FIGS. 3E and 3F, a laser lift-off process is performed to separate the epitaxy structures 300 from the epitaxy substrate 30. In detail, the laser lift-off process is performed by using a laser beam L irradiating to the epitaxy structures 300 through the epitaxy substrate 30. The laser beam L with high energy can make the material of the first patterned semi-conductor layer 32 such as GaN decompose into Ga metal and $N_2$ gas, and thus separate the epitaxy structures 300 from the epitaxy substrate 30. In the embodiment, the patterned passivation layer 40 does not cover on the first thinner portion 32a of the first patterned semi-conductor layer 32. Therefore, the patterned passivation layer 40 is not cracked or peeled by the pressure of the escaping $N_2$ gas generating in the laser lift-off process, and the yield rate is improved. $N_2$ gas generated in the laser lift-off process can dissipate from the first thinner portion 32a of the first patterned semi-conductor layer 32 because the first thinner portion 32a is thinner and weaker than other portions. In other words, the first thinner portion 32a may be easily broken and may have certain cracks C during the laser lift-off process, which provides a dissipation path of the escaping gas. Accordingly, the dissipation of $N_2$ gas does not have impact on the patterned passivation layer 40. Thus, the patterned passivation layer 40 is not damaged in the embodiment.

Figure 3G:
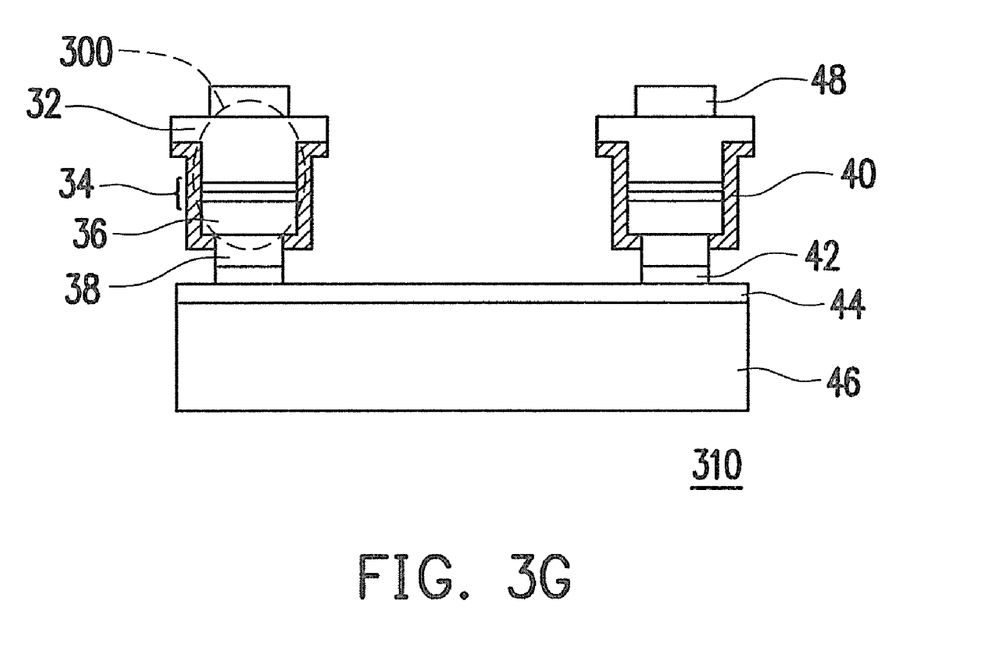

Then, referring to FIG. 3G, an electrode 48 is formed on each of the epitaxy structures 300 so as to form an LED element 310, wherein a plurality of epitaxy structures 300 are disposed on the carrier substrate 36. It is worthy to note that the patterned passivation layer 40 is not cracked during the foregoing laser lift-off process so that a path of a leakage current is constrained. Therefore, the LED element 310 has increased quality and enhanced yield rate. In addition, the epitaxy structures 300 can be bonded to a carrier substrate (not shown) through an electroplating process or an electroless plating process in other embodiments so that the epitaxy structures 300 are embedded in the carrier substrate (not shown) as shown in FIG. 2C.

Figure 4A:
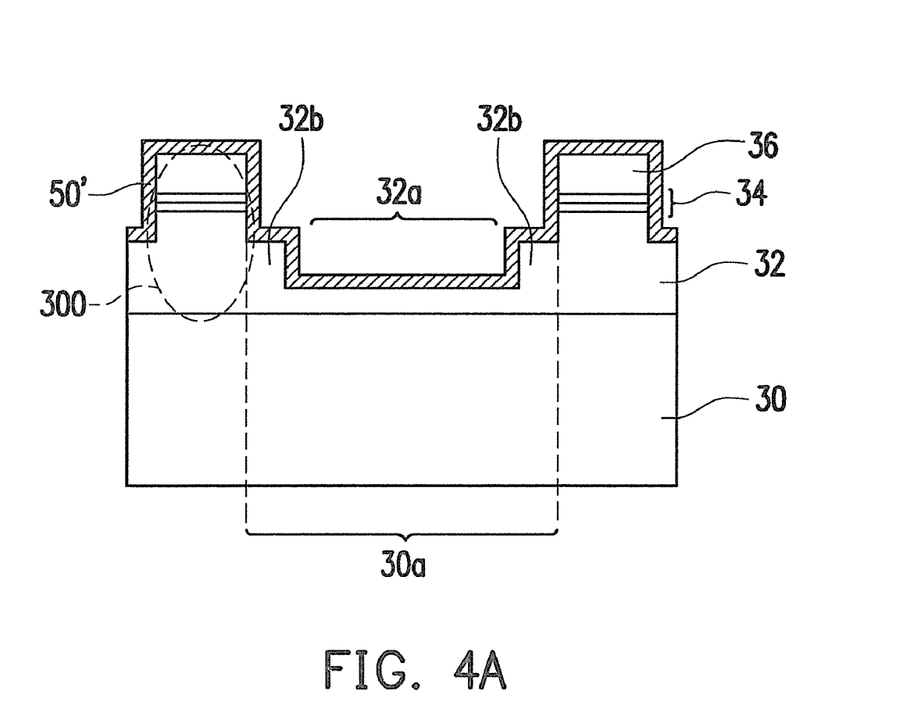
FIGS. 4A through 4H illustrate a method of manufacturing an LED element according to further another embodiment of the disclosure.

FIGS. 4A through 4H illustrate a method of manufacturing an LED element according to further another embodiment. Referring to FIG. 4A, the epitaxy substrate 30 with the first patterned semi-conductor layer 32, the patterned light emitting layer 34 and the second patterned semi-conductor layer 36 disposed thereon as shown in FIG. 3B is provided. The methods of forming the first patterned semi-conductor layer 32, the patterned light emitting layer 34 and the second patterned semi-conductor layer 36 are the same as those described in the foregoing embodiments and are abbreviated here. Then, a passivation layer 50' is formed on the epitaxy substrate 30 and covers the first thinner portion 32a, the second thinner portion 32b, and the epitaxy structures 300. The material of the pasivation layer 50' can be $SiO_2$, $SiN_x$, etc. In addition, the reference numbers in the embodiment which are the same as those in the above embodiments refer to the same or like parts.

Figure 4B:
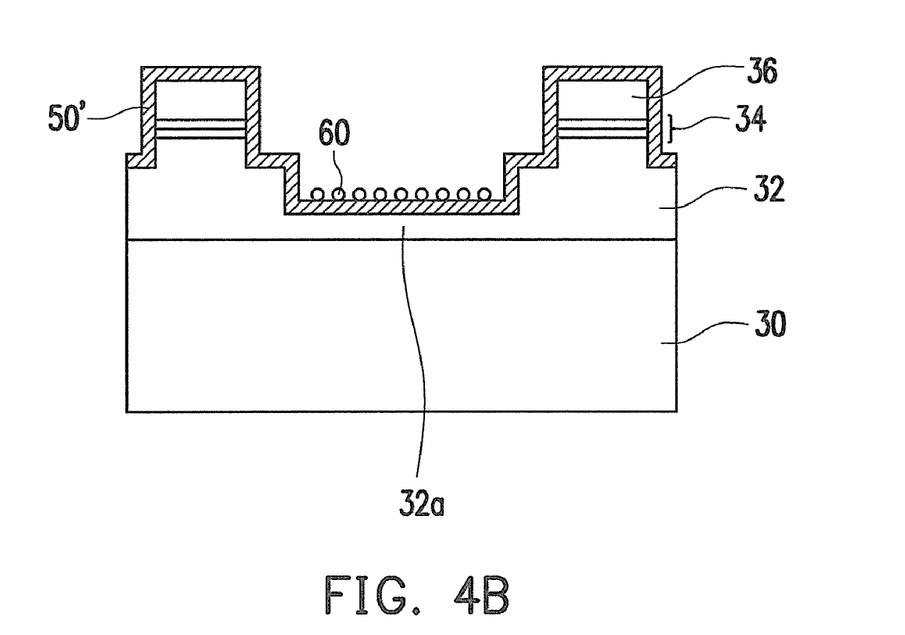

Next, referring to FIG. 4B, a plurality of nano-cover balls 60 are formed on the passivation layer 50' above the first thinner portion 32a of the first patterned semi-conductor layer 32. The method of forming the nano-cover balls 60 includes forming a metal layer on the passivation layer 50' above the first thinner portion 32a and performing a high temperature process. The metal layer disposed on the passivation layer 50' which can be made of $SiO_2$ is transformed into a plurality of nano-cover balls 60 by the surface tension during the high temperature process. A process temperature of the high temperature process is 800° C. to 950° C., and the metal layer can be Ni layer.

Figure 4C:
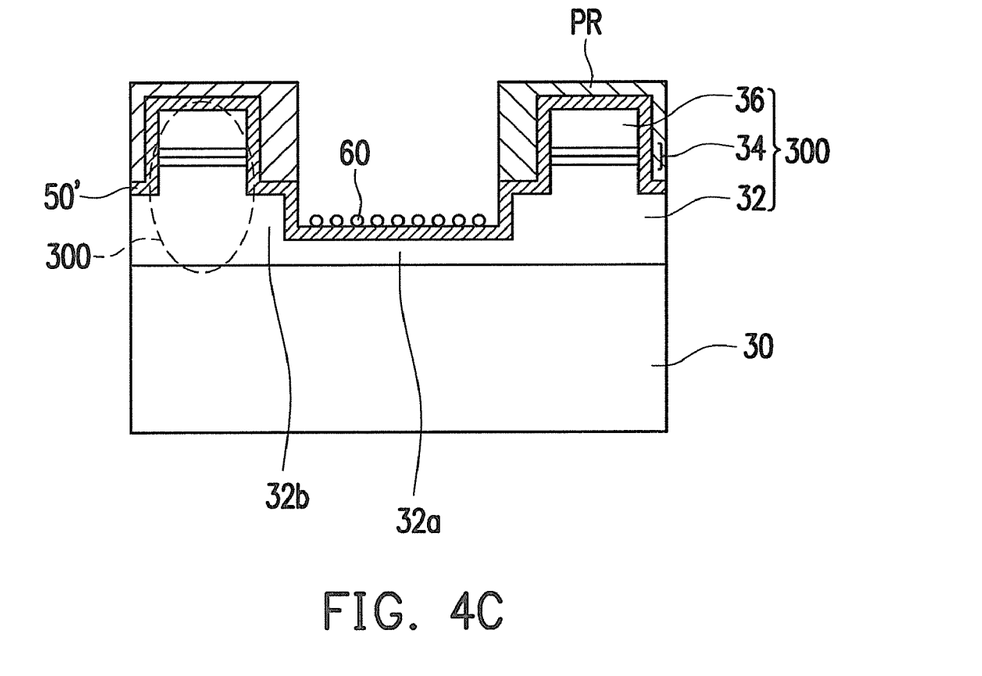
Figure 4D:
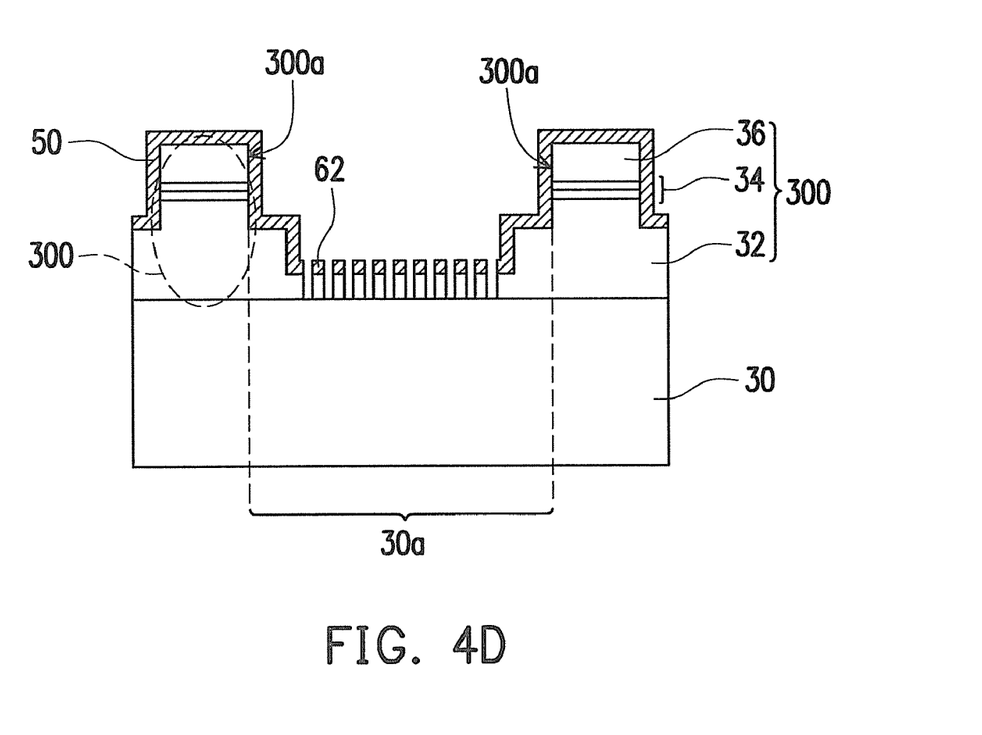

Furthermore, referring to FIGS. 4C and 4D, a patterned mask layer PR is formed on the epitaxy substrate 30, and covers the passivation layer 50' above the epitaxy structures 300 and above the second thinner portion 32b of the first patterned semi-conductor layer 32. Then, an etching process is performed on the epitaxy substrate 30 by using the nano-cover balls 60 and the patterned mask layer PR as masks to remove a part of the passivation layer 50' and a part of the first thinner portion 32a so as to form the patterned passivation layer 50 and a plurality of nano-pillars 62. Herein, the patterned mask layer PR is, for example, made by photoresist material. The nano-pillars 62 are located inside the non-epitaxy area 30a and between two adjacent epitaxy structures 300. The patterned passivation layer 50 covers the side walls 300a of the epitaxy structures 300 and is not continuous in the non-epitaxy area 30a.

Figure 4E:
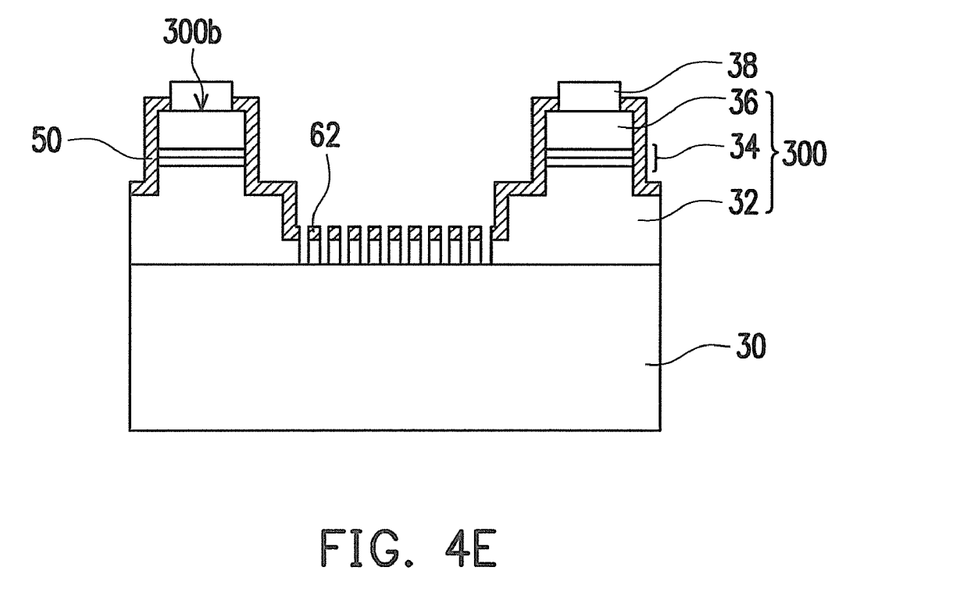
Figure 4F:
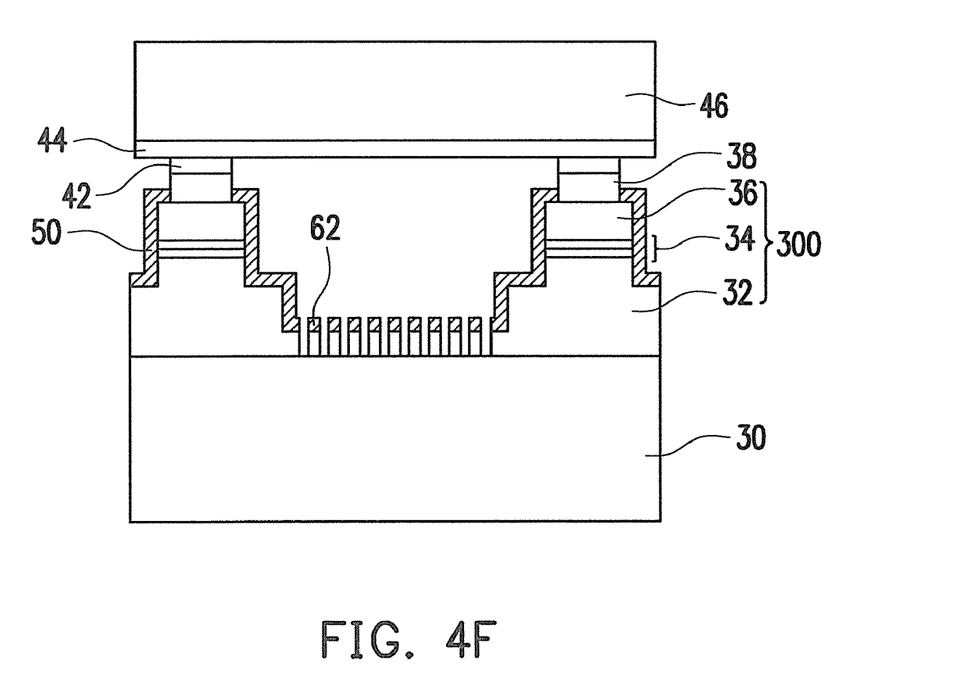

Referring to FIG. 4E, a part of the patterned passivation layer 50 located on a top 300b of each of the epitaxy structures 300 is further removed and a patterned reflector 38 is further disposed on the top 300b of each of the epitaxy structures 300. Then, referring to FIG. 4F, a eutectic connection process is performed so as to bond the epitaxy structures 300 to a carrier substrate 46 through an adhesive layer 44. For preventing the diffusion effect, a barrier layer 42 is further disposed between the patterned reflectors 38 and the adhesive layer 44 before the eutectic connection process. In the embodiment, the materials of the barrier layer 42, the adhesive layer 44 and the carrier substrate 46 can be the same as those in the foregoing embodiments.

Figure 4G:
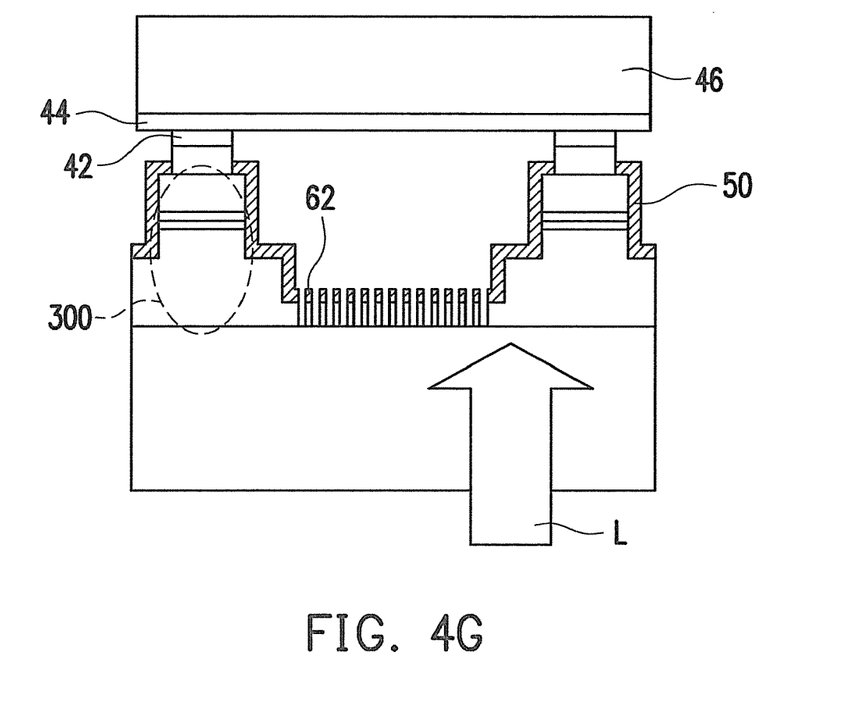

Next, referring to FIG. 4G, a laser lift-off process is performed to separate the epitaxy structures 300 from the epitaxy substrate 30. Owing to the dispositions of the nano pillars 62, $N_2$ gas generated by the decomposition of the material of the first patterned semi-conductor layer 32 during the laser lift-off process is dissipated easily through the space between the nano pillars 62. Accordingly, the patterned passivation layer 50 is not cracked by the pressure of $N_2$ gas, and the characteristic of element is increased.

Figure 4H:
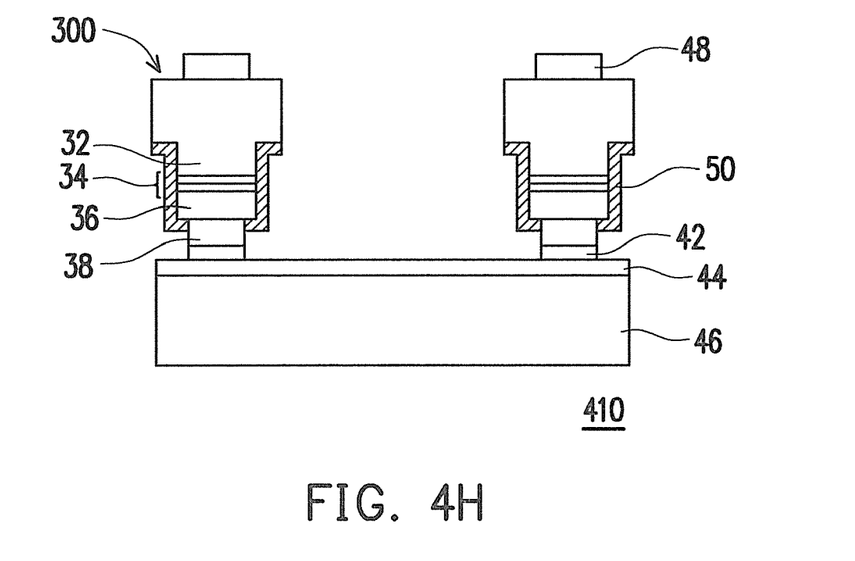

Then, referring to FIG. 4H, an electrode 48 is formed on each of the epitaxy structures 300 so as to form an LED element 410. By the completeness and continuity of the patterned passivation layer 50 on the side walls of the epitaxy structures 300, a path of a leakage current in the LED element is not generated, and thus the LED element 410 has increased quality and increased characteristic.

The LED elements 310 and 410 are manufactured by eutectic connection process, but the embodiment is not limited. In other embodiments, the LED elements 310 and 410 can be manufactured by electroplating process or non-electroplating process, and therefore the epitaxy structures 300 are embedded in the carrier substrate.

In view of the above, the method of manufacturing the LED elements in the embodiment includes forming a weak structure such as a thinner portion or a plurality of pillars between the epitaxy structures on the epitaxy substrate and making the patterned passivation layer non-continuous at where the weak structure is. The gas generated during the laser lift-off process can dissipate from the weak structure and does not cause high pressure on the patterned passivation layer. Therefore, the patterned passivation layer is not cracked or peeled, and thus the LED element made by the method of the disclosure has increased characteristic. In addition, the method of manufacturing the LED elements has increased yield rate.

It will be apparent to those skilled in the art that various modifications and variations can be made to the structure of the embodiment without departing from the scope or spirit of the embodiment. In view of the foregoing, it is intended that the embodiment cover modifications and variations of this embodiment provided they fall within the scope of the following claims and their equivalents.

What is claimed is:

1. A method of manufacturing a light emitting diode element comprising:

forming a first patterned semi-conductor layer, a patterned light emitting layer, and a second patterned semi-conductor layer sequentially on an epitaxy substrate so as to form a plurality of epitaxy structures, wherein the first patterned semi-conductor layer has a thinner portion in a non-epitaxy area outside the epitaxy structures;

forming a passivation layer covering the epitaxy structures and the thinner portion;

removing a part of the passivation layer covering on the thinner portion to form a patterned passivation layer such that the patterned passivation layer has at least a gap corresponding to the thinner portion;

forming a patterned reflector directly on each of the epitaxy structures;

bonding the epitaxy structures to a carrier substrate;

performing a lift-off process to separate the epitaxy structures from the epitaxy substrate; and forming an electrode on each of the epitaxy structures far from the patterned reflector.

2. The method of manufacturing a light emitting diode element as claimed in claim 1, wherein the method of forming a first patterned semi-conductor layer, a patterned light emitting layer, and a second patterned semi-conductor layer comprises:

forming a first semiconductor layer, a light emitting layer, and a second semiconductor layer sequentially on the epitaxy substrate; and removing a part of the first semiconductor layer, a part of the light emitting layer, and a part of the second semiconductor layer so that the epitaxy structures are formed and a thickness of the thinner portion is thinner than a thickness of the first semiconductor layer.

3. The method of manufacturing a light emitting diode element as claimed in claim 1, wherein the method of forming the patterned first semiconductor layer comprises forming the thinner portion having a first thinner portion and a second thinner portion, the second thinner portion is located between the first thinner portion and the epitaxy structures, and the first thinner portion is thinner than the second thinner portion.

4. The method of manufacturing a light emitting diode element as claimed in claim 3, wherein the method of removing the part of the passivation layer covering on the thinner portion comprises partially removing a part of the passivation layer directly on the first thinner portion.

5. The method of manufacturing a light emitting diode element as claimed in claim 1, wherein the method of removing the part of the passivation layer covering on the thinner portion comprises:

forming a plurality of nano-cover balls on the passivation layer above the thinner portion; and removing the part of the passivation layer and the underlying thinner portion by using the nano-cover balls as a mask so as to form a plurality of nano-pillars in the non-epitaxy area.

6. The method of manufacturing a light emitting diode element as claimed in claim 5, wherein the method of forming the nano-cover balls comprises:

forming a metal layer on the passivation layer in the non-epitaxy area; and performing a high temperature process so as to form the nano-cover balls.

7. The method of manufacturing a light emitting diode element as claimed in claim 6, wherein a process temperature of the high temperature process is 800° C. to 950° C.

8. The method of manufacturing a light emitting element diode element as claimed in claim 5, wherein the method of removing the part of the passivation layer covering on the thinner portion further comprises:

forming the nano-cover balls and a patterned mask layer covering the epitaxy structures; and removing the part of the passivation layer and the underlying thinner portion by using the nano-cover balls and the patterned mask layer as the mask so as to form the nano-pillars in the non-epitaxy area.

9. The method of manufacturing a light emitting diode element as claimed in claim 5, wherein a material of the nano-cover balls comprises Ni.

10. The method of manufacturing a light emitting diode element as claimed in claim 1, wherein the method of bonding the epitaxy structures to the carrier substrate comprises performing a eutectic connection process.

11. The method of manufacturing a light emitting diode element as claimed in claim 10, wherein the method of performing the eutectic connection process comprises:

forming an adhesive layer on the carrier substrate; and connecting the patterned reflectors to the carrier substrate through the adhesive layer.

12. The method of manufacturing a light emitting diode element as claimed in claim 11, further comprises forming a barrier layer on the patterned reflectors before performing the eutectic connection process so that the patterned reflectors are connected to the carrier substrate through the barrier layer and the adhesive layer.

13. The method of manufacturing a light emitting diode element as claimed in claim 11, wherein a material of the adhesive layer comprises AuSn or Au.

14. The method of manufacturing a light emitting diode element as claimed in claim 1, wherein the method of bonding the epitaxy structures to the carrier substrate comprises:

forming a seed layer on the epitaxy substrate; and performing an electroplating process or an electroless plating process to form the carrier substrate.

15. The method of manufacturing a light emitting diode element as claimed in claim 1, wherein the method of forming the patterned reflector directly on each of the epitaxy structures comprises removing another part of the passivation layer covering on a top of each of the epitaxy structures and forming the patterned reflector on the top of each of the epitaxy structures.

16. The method of manufacturing a light emitting diode element as claimed in claim 1, wherein a thickness of the passivation layer is from 0.1 um to 1 um.

17. The method of manufacturing a light emitting diode element as claimed in claim 1, wherein a thickness of the passivation layer is from 0.3 um to 0.9 um.

18. The method of manufacturing a light emitting diode element as claimed in claim 1, wherein a thickness of the passivation layer is from 0.3 um to 0.6 um.

19. The method of manufacturing a light emitting diode element as claimed in claim 1, wherein the epitaxy substrate is a sapphire substrate.

20. The method of manufacturing a light emitting diode element as claimed in claim 1, wherein the lift-off process comprises a laser lift-off process.

* * * * *